(12) United States Patent
Jang et al.

(10) Patent No.: US 7,486,539 B2
(45) Date of Patent: Feb. 3, 2009

(54) MEMORY ARRAY USING MECHANICAL SWITCH, METHOD FOR CONTROLLING THE SAME, DISPLAY APPARATUS USING MECHANICAL SWITCH, AND METHOD FOR CONTROLLING THE SAME

(75) Inventors: Weon Wi Jang, Daejeon (KR); O-Deuk Kwon, Daegu (KR); Jeong Oen Lee, Daejeon (KR); Jun-Bo Yoon, Daejeon (KR)

(73) Assignee: Korea Advanced Instutute of Science & Technology, Daejeon (KR)

( * ) Notice: Subject to any disclaimer, the term of this patent is extended or adjusted under 35 U.S.C. 154(b) by 186 days.

(21) Appl. No.: 11/556,451

(22) Filed: Nov. 3, 2006

(65) Prior Publication Data

US 2007/0121362 A1 May 31, 2007

(30) Foreign Application Priority Data

Nov. 29, 2005 (KR) ...................... 10-2005-0114665

(51) Int. Cl.
*G11C 7/00* (2006.01)
(52) U.S. Cl. ...................................... 365/149; 365/145
(58) Field of Classification Search ................. 365/149, 365/145, 108, 117; 359/290, 291
See application file for complete search history.

(56) References Cited

U.S. PATENT DOCUMENTS

| 4,681,403 | A | 7/1987 | Te Velde et al. |
| 6,509,605 | B1 | 1/2003 | Smith |
| 6,534,839 | B1 | 3/2003 | Frazier et al. |
| 6,884,950 | B1 * | 4/2005 | Nicholson et al. ............ 200/181 |

OTHER PUBLICATIONS

Teh et al., "Switching Characteristics of Electrostatically Actuated Miniaturized Micromechanical Metallic Cantilevers," *J. Vac. Sci. Technol.* B 21(6), Nov./Dec. 2003, pp. 2360-2367.
Nathanson et al., "The Resonant Gate Transistor," *IEEE Transaction on Electron Devices*, vol. ED-14, No. 3, pp. 117-133, Mar. 1967.

* cited by examiner

*Primary Examiner*—Vu A Le
(74) *Attorney, Agent, or Firm*—Foley & Lardner LLP

(57) ABSTRACT

Provided are a memory array using a mechanical switch, a method for controlling the same, a display apparatus using a mechanical switch, and a method for controlling the same. The memory array comprises a plurality of word lines, a plurality of bit lines intersecting each other with the plurality of word lines, and a plurality of the mechanical switches. The mechanical switch comprises a gate electrode, a drain electrode, and a source electrode.

10 Claims, 3 Drawing Sheets

MEMORY ARRAY USING MECHANICAL SWITCH, METHOD FOR CONTROLLING THE SAME, DISPLAY APPARATUS USING MECHANICAL SWITCH, AND METHOD FOR CONTROLLING THE SAME

This Nonprovisional application claims priority under 35 U.S.C. § 119(a) on Patent Application No. 10-2005-0114665 filed in Korea on Nov. 29, 2005, the entire contents of which are hereby incorporated by reference.

BACKGROUND

1. Field

The present invention relates to a memory array using a mechanical switch, a method for controlling the same, a display apparatus using a mechanical switch, and a method for controlling the same, and more particularly, to a memory array constructed using a mechanical switch, a method for controlling the memory array, a display apparatus constructed using a mechanical switch, and a method for controlling the display apparatus.

2. Description of the Background Art

Until now, a degree of integration of a semiconductor transistor greatly increases according to Moore's law, thereby much contributing to the development of a semiconductor industry. In general, the semiconductor transistor has been used as a switching device using an on or off characteristic and an amplifying device using a current and voltage amplification characteristic. In a digital integration circuit particularly, the semiconductor transistor has been mainly used as the switching device. However, the semiconductor transistor has a drawback that it should be necessarily formed on a semiconductor substrate and thus, should consider a body effect of the semiconductor substrate. Particularly, the semiconductor transistor has a drawback of a leakage of electrical charges inevitably caused by its internal leakage source. In addition, the semiconductor transistor has a drawback that its sensitivity to an external harmful environment such as radiation causes a soft error (SE). The semiconductor transistor has a drawback that a degradation of its gate oxide causes a reduction of an electrical reliability, and an increase of the degree of integration causes a short channel effect such as junction leakage and hot electron injection.

In order to overcome conventional several drawbacks of the semiconductor transistor serving as the switching device, a mechanical switch using a recent Micro-ElectroMechanical System (MEMS) or Nano-ElectroMechanical System (NEMS) is being researched and developed.

FIG. 1 is a conceptual diagram illustrating a conventional mechanical switch. Referring to FIG. 1, the conventional mechanical switch, which is disclosed in U.S. Pat. No. 6,534,839 and W. H. Teh, et. al., "Switching characteristics of electrostatically actuated miniaturized micromechanical metallic catilevers", J. Vac. Sci. Technol., B. 21, pp. 2360-2367, 2003, is of a structure comprising a gate electrode 10, a drain electrode 30, and a source electrode 20 comprised of an anchor part 21 and a mobile part 22. An operation of the mechanical switch is characterized in that the mobile part 22 of the source electrode 20 electrically contacts with the drain electrode 30, thereby electrically conducting the source electrode 20 and the drain electrode 30 in generation of an electrostatic force based on a voltage difference between the gate electrode 10 and the source electrode 20, and the source electrode 20 and the drain electrode 30 are electrically disconnected in the absence of the generation of the electrostatic force.

Specifically, operation of the mechanical switch by the electrostatic force is based on, not a principle in which the mobile part 22 of the source electrode 20 is linearly displaced toward the drain electrode 30 and is in electric contact with the drain electrode 30 in proportional to the voltage difference between the source electrode 20 and the gate electrode 10, but a principle in which an unstable state (Hereinafter, referred to as "pull-in state") where the electrostatic force between the mobile part 22 of the source electrode 20 and the gate electrode 10 is greater than an elastic resilient force of the mobile part 22 of the source electrode 20 at more than a certain voltage (Hereinafter, referred to as "pull-in voltage ($V_{pi}$)") between two electrodes occurs, and the mobile part 22 of the source electrode 20 instantaneously gets in electric contact with the drain electrode 30. In other words, the pull-in voltage can be defined as the voltage difference between the source electrode 20 and the gate electrode 10, required for electrically conducting the source electrode 20 and the drain electrode 30 of the mechanical switch. The pull-in state occurs when the mobile part 22 of the source electrode 20 shifts by one third of a distance between the mobile part 22 of the source electrode 20 and the gate electrode 10. The pull-in voltage is similar in function with a threshold voltage of a metal oxide semiconductor (MOS) transistor (H. C. Nathanson, et. al., "The resonant gate transistor", IEEE Transactions on Electron Devices, Vol. ED-104, No. 3, pp. 117-133, 1967).

U.S. Pat. No. 6,509,605 discloses a memory array constructed using a mechanical switch, in which a operation voltage is low and a operation speed is fast and thus, a power consumption is low and writing and reading time are short as well as an electrical reliability is not deteriorated because of mechanical actuation, and a sensitivity to radiation is poor. The '605 memory array is being researched and developed as a next generation memory array to replace a conventional memory array. However, the memory array cannot be controlled because of its construction using only the mechanical switch and thus, has a drawback in that it should be constructed in combination with a complementary metal oxide semiconductor (CMOS) transistor. Accordingly, the memory array gets so complex in construction and process and causes a scaling limit, thereby reducing a degree of integration.

A research for using the mechanical switch as a selection transistor of a display apparatus (U.S. Pat. No. 4,681,403) such as a liquid crystal display (LCD), thereby being more advantageous for a large-area integration, and more improving a product yield and a manufacturing cost owing to a simple manufacturing process than in conventional MOS transistor or thin film transistor (TFT) is in progress. However, the display apparatus using the mechanical switch disclosed in the U.S. Pat. No. '403 has a disadvantage in that a pixel voltage for embodying a gray level cannot variously be changeable.

FIG. 2 is a circuit diagram illustrating a conventional memory array using a MOS transistor. Referring to FIG. 2, an input voltage of a source voltage or a ground voltage is applied to a bit line (B/L0) connecting to a selected MOS transistor of a memory cell 90, and a threshold voltage or more of the MOS transistor is applied to a word line (W/L0) connecting to the selected MOS transistor. Thus, the applied voltage of the bit line (B/L0) is transferred to a storage unit 80 through electrically conducted source electrode 60 and drain electrode 70, and the applied voltage of the bit line (B/L0) is stored in the storage unit 80. Less than the threshold voltage is applied to word lines (W/L1 and W/L2) not connecting to the selected MOS transistor. Thus, the source electrode 60 and the drain electrode 70 electrically disconnect with each other, and the applied voltage of the bit line is not transferred to the storage unit 80. A method for controlling the memory array using the MOS transistor is different from a method for controlling a memory array using a mechanical switch. Therefore, a control method different from the conventional method of controlling the memory array using the MOS transistor is being required for effectively controlling the memory array using the mechanical switch.

SUMMARY

Accordingly, the present invention is to provide a memory array constructed using a mechanical switch with a dimple.

Also, the present invention is to provide a method for controlling a memory array using a mechanical switch.

Also, the present invention is to provide a display apparatus constructed using a mechanical switch with a dimple.

Also, the present invention is to provide a method for controlling a display apparatus using a mechanical switch.

In one aspect, there is provided a memory array using a mechanical switch. The memory array comprises a plurality of word lines, a plurality of bit lines intersecting each other with the plurality of word lines, and a plurality of the mechanical switches. The mechanical switch disposed at an intersection of the plurality of word lines and the plurality of bit lines comprises a gate electrode connecting with each of the word lines, a drain electrode spaced apart from the gate electrode and connecting to a capacitor, and a source electrode. The source electrode comprises an anchor part spaced apart from the gate electrode and connecting to each of the bit lines, a mobile part extending from the anchor part and spaced apart from the gate electrode, and a dimple extending from the mobile part and formed in a protrusion shape.

Implementations may include one or more of the following features. For example, in each of the mechanical switches, the dimple of the source electrode electrically contacts with the drain electrode by a difference between a voltage applied to the gate electrode and a voltage applied to the source electrode, and the voltage applied to the source electrode is transferred to the drain electrode.

Implementations may include one or more of the following features. For example, the capacitor comprises a first electrode, a second electrode, and a dielectric layer formed between the first electrode and the second electrode.

Implementations may include one or more of the following features. For example, the first electrode is a conductive electrode formed on a conductive semiconductor substrate or a nonconductive semiconductor substrate.

Implementations may include one or more of the following features. For example, the dielectric layer is formed of silicon oxide or silicon nitride.

Implementations may include one or more of the following features. For example, the second electrode is formed of conductive material comprising any one of copper, carbon nano tube, and polysilicon.

Implementations may include one or more of the following features. For example, the gate electrode, the source electrode, and the drain electrode of each of the mechanical switches are formed of conductive material comprising any one of copper, carbon nano tube, and polysilicon.

Implementations may include one or more of the following features. For example, the plurality of word lines and the plurality of bit lines are formed of conductive material comprising any one of copper, carbon nano tube, and polysilicon.

In another aspect, there is provided a method for controlling a memory array using a mechanical switch, in which the memory array comprises a plurality of word lines, a plurality of bit lines intersecting each other with the plurality of word lines, and a plurality of the mechanical switches. The mechanical switch disposed at an intersection of the plurality of word lines and the plurality of bit lines comprises a gate electrode connecting with each of the word lines, a drain electrode spaced apart from the gate electrode and connecting to a capacitor, and a source electrode. The source electrode comprises an anchor part spaced apart from the gate electrode and connecting to each of the bit lines, a mobile part extending from the anchor part and spaced apart from the gate electrode, and a dimple extending from the mobile part and formed in a protrusion shape. The method comprises steps of: applying a voltage greater than a sum of a maximal voltage ($V_{B/L, \, max}$) of the bit line and a pull-in voltage or a voltage smaller than a difference between a minimal voltage ($V_{B/L, \, min}$) of the bit line and the pull-in voltage, to the word line selected from the plurality of word lines; and applying a voltage smaller than a sum of the minimal voltage ($V_{B/L \, min}$) of the bit line and the pull-in voltage and greater than a difference between the maximal voltage ($V_{B/L, \, max}$) of the bit line and the pull-in voltage, to the word lines unselected from the plurality of word lines.

Implementations may include one or more of the following features. For example, the pull-in voltage is greater than a difference between the maximal voltage ($V_{B/L, \, max}$) of the bit line and the minimal voltage ($V_{B/L, \, min}$) of the bit line.

In a further another aspect, there is provided a display apparatus using a mechanical switch. The display apparatus comprises a plurality of scan lines, a plurality of data lines intersecting each other with the plurality of scan lines, and a plurality of the mechanical switches. The mechanical switch disposed at an intersection of the plurality of word lines and the plurality of bit lines comprises a gate electrode connecting with each of the word lines, a drain electrode spaced apart from the gate electrode and connecting to a capacitor, and a source electrode. The source electrode comprises an anchor part spaced apart from the gate electrode and connecting to each of the bit lines, a mobile part extending from the anchor part and spaced apart from the gate electrode, and a dimple extending from the mobile part and formed in a protrusion shape.

Implementations may include one or more of the following features. For example, in each of the mechanical switches, the dimple of the source electrode electrically contacts with the drain electrode by a difference between a voltage applied to the gate electrode and a voltage applied to the source electrode, and the voltage applied to the source electrode is transferred to the drain electrode.

Implementations may include one or more of the following features. For example, the gate electrode, the source electrode, and the drain electrode of each of the mechanical switches are formed of conductive material comprising any one of copper, carbon nano tube, and polysilicon.

Implementations may include one or more of the following features. For example, the plurality of scan lines and the plurality of data lines are formed of conductive material comprising any one of copper, carbon nano tube, and polysilicon.

In a still further another aspect, there is provided a method for controlling a display apparatus using a mechanical switch, in which the display apparatus comprises a plurality of scan lines, a plurality of data lines intersecting each other with the plurality of scan lines, and a plurality of the mechanical switches. The mechanical switch disposed at an intersection of the plurality of word lines and the plurality of bit lines comprises a gate electrode connecting with each of the word lines, a drain electrode spaced apart from the gate electrode and connecting to a capacitor, and a source electrode. The source electrode comprises an anchor part spaced apart from the gate electrode and connecting to each of the bit lines, a mobile part extending from the anchor part and spaced apart from the gate electrode, and a dimple extending from the mobile part and formed in a protrusion shape. The method comprises steps of: applying a voltage greater than a sum of a maximal voltage ($V_{D/L, max}$) of the data line and a pull-in voltage or a voltage smaller than a difference between a minimal voltage ($V_{D/L\ min}$) of the data line and the pull-in voltage, to the scan line selected from the plurality of scan lines, and applying a voltage smaller than a sum of the minimal voltage ($V_{D/L, min}$) of the data line and the pull-in voltage and greater than a difference between the maximal voltage ($V_{D/L, max}$) of the data line and the pull-in voltage, to the scan lines unselected from the plurality of scan lines.

Implementations may include one or more of the following features. For example, the pull-in voltage is greater than a difference between the maximal voltage ($V_{D/L, max}$) of the data line and the minimal voltage ($V_{D/L\ min}$) of the data line.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

Figure 1:
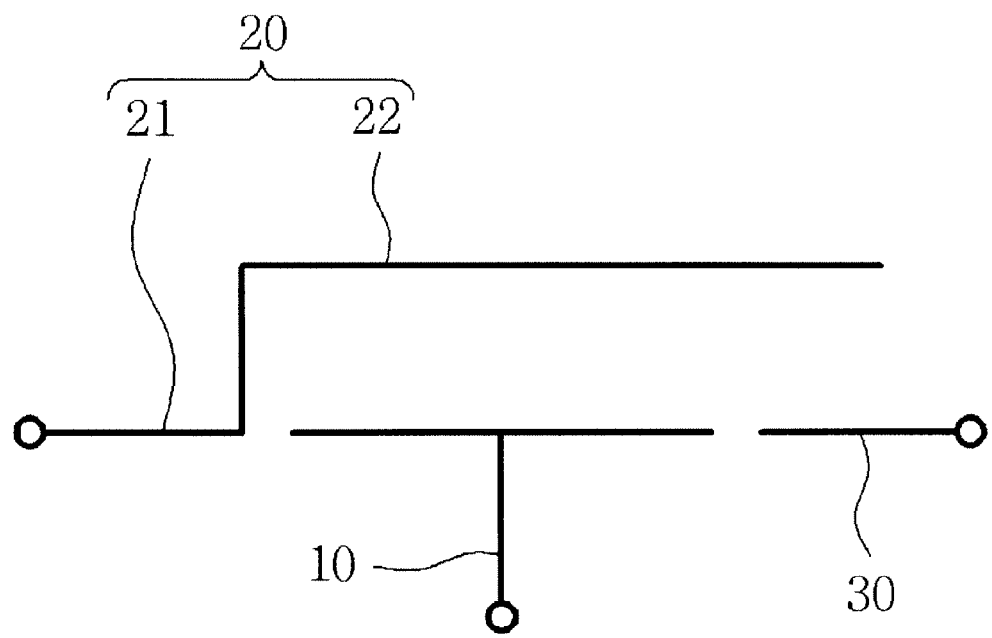
FIG. 1 is a conceptual diagram illustrating a conventional mechanical switch.
Figure 2:
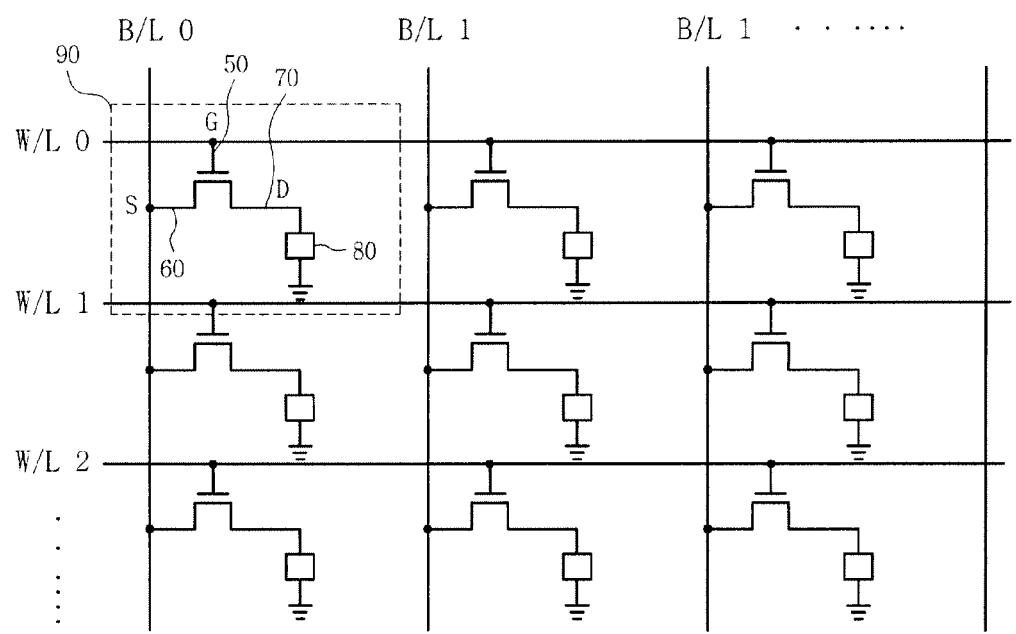
FIG. 2 is a circuit diagram illustrating a conventional memory array using a MOS transistor.
Figure 3:
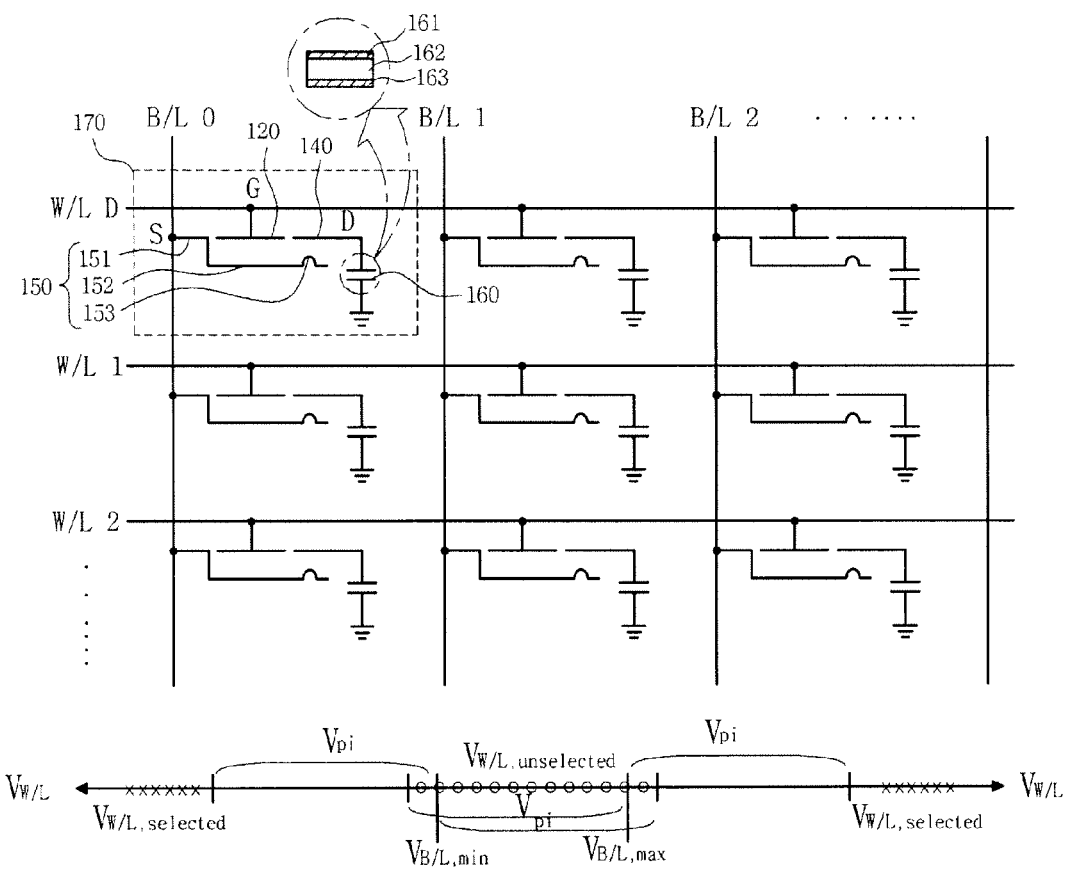
FIG. 3 is a circuit diagram illustrating a memory array using a mechanical switch according to an exemplary embodiment of the present invention.

FIG. 3 is a circuit diagram illustrating a memory array using a mechanical switch according to an exemplary embodiment of the present invention.

As shown in FIG. 3, the memory array using the mechanical switch according to an exemplary embodiment of the present invention comprises a plurality of word lines (W/L0, W/L1, and W/L2), a plurality of bit lines (B/L0, B/L1, and B/L2), and a plurality of the mechanical switches.

The plurality of bit lines (B/L0, B/L1, and B/L2) intersects each other with the plurality of word lines (W/L0, W/L1, and W/L2). The plurality of mechanical switches is disposed at an intersection of the plurality of word lines (W/L0, W/L1, and W/L2) and the plurality of bit lines (B/L0, B/L1, and B/L2). Each of the mechanical switches comprises a gate electrode 120 connecting with each of the word lines (W/L0, W/L1, and W/L2); a drain electrode 140 spaced apart from the gate electrode 120 and connecting to a capacitor 160; and a source electrode 150. The source electrode 150 comprises an anchor part 151 spaced apart from the gate electrode 120 and connecting to each of the bit lines (B/L0, B/L1, and B/L2); a mobile part 152 extending from the anchor part 151 and spaced apart from the gate electrode 120; and a dimple 153 extending from the mobile part 152 and formed in a protrusion shape.

In each of the plurality of mechanical switches, the dimple 153 of the source electrode 150 contacts with the drain electrode 140 by a difference between a voltage applied to the gate electrode 120 and a voltage applied to the source electrode 150, and the voltage applied to the source electrode 150 is transferred to the drain electrode 140. In other words, when the difference between the voltage applied to the gate electrode 120 and the voltage applied to the source electrode 150 is more than a pull-in voltage ($V_{pi}$), an electrostatic force is generated, thereby making the dimple 153 of the source electrode 150 electrically contact with the drain electrode 140, and transferring the voltage applied to the source electrode 150 to the drain electrode 140.

In generation of the electrostatic force, the dimple 153 of the source electrode 150 contacts with the drain electrode 140 so that the voltage applied to the source electrode 150 can be transferred to the capacitor through the drain electrode 140. In the absence of the generation of the electrostatic force, the dimple 153 of the source electrode 150 is again restored to an original position by an elastic force, and does not contact with the drain electrode 140. As such a structure, a cantilever is typical. Also, the dimple 153 of the source electrode 150 can not only prevents a stiction in a manufacturing process of the mechanical switch but also reduces the pull-in voltage ($V_{pi}$).

In each of the plurality of mechanical switches, the gate electrode 120, the source electrode 150, and the drain electrode 140 can be formed of conductive material comprising any one of copper, carbon nano tube, and polysilicon. The plurality of word lines (W/L0, W/L1, and W/L2) and the plurality of bit lines (B/L0, B/L1, and B/L2) can be formed of conductive material comprising any one of copper, carbon nano tube, and polysilicon.

The capacitor 160 comprises a first electrode 161, a second electrode 163, and a dielectric layer 162 formed between the first electrode 161 and the second electrode 163. The first electrode 161 can be manufactured by a conductive semiconductor substrate, or can be manufactured by forming a conductive electrode on a nonconductive substrate. In case where the first electrode is manufactured by the conductive semiconductor substrate, it can use a silicon substrate. The dielectric layer 162 can be formed of silicon oxide or silicon nitride. The second electrode 163 can be formed of conductive material comprising any one of copper, carbon nano tube, and polysilicon.

In order to effectively control memory cells of the memory array using the mechanical switch according to an exemplary embodiment of the present invention, voltages are applied to the plurality of word lines (W/L0, W/L1, and W/L2) under the conditions of ① and ③.

① Condition of applying voltage to selected word line:

$|V_{W/L, selected} - V_{B/L}| > V_{pi}$ $(V_{W/L, selected} > V_{B/L, max} + V_{pi}$ or $V_{W/L, selected} > V_{B/L, min} - V_{pi})$ ② Condition of applying voltage to unselected word line:

$|V_{W/L, selected} - V_{B/L}| < V_{pi}$ $(V_{B/L, max} - V_{pi} < V_{W/L, unselected} < V_{B/L, min} + V_{pi})$ ③ Pull-in voltage:

$V_{pi} > |V_{B/L, max} - V_{B/L, min}|$

A voltage ($V_{W/L, selected} > V_{B/L, max} + V_{pi}$) greater than a sum of a maximal voltage ($V_{B/L, max}$) of the bit line and the pull-in voltage ($V_{pi}$) or a voltage ($V_{W/L,selected} < V_{B/L,min} - V_{pi}$) smaller than a difference between a minimal voltage ($V_{B/L,min}$) of the bit line and the pull-in voltage ($V_{pi}$) is applied to the word line (W/L0) selected from the plurality of word lines (W/L0, W/L1, and W/L2). A voltage ($V_{B/L,max} - V_{pi} < V_{W/L,unselected} < V_{B/L,min} + V_{pi}$) smaller than a sum of the minimal voltage ($V_{B/L,min}$) of the bit line and the pull-in voltage ($V_{pi}$) and greater than a difference between the maximal voltage ($V_{B/L,max}$) of the bit line and the pull-in voltage ($V_{pi}$) is applied to the word lines (W/L1 and W/L2) unselected from the plurality of word lines (W/L0, W/L1, and W/L2). The pull-in voltage ($V_{pi} > |V_{B/L,max} - V_{B/L,min}|$) is greater than a difference between the maximal voltage ($V_{B/L,max}$) of the bit line and the minimal voltage ($V_{B/L,min}$) of the bit line. The maximal voltage ($V_{B/L,max}$) of the bit line refers to a voltage for indicating a high state of data stored in the capacitor 160. The minimal voltage ($V_{B/L,min}$) of the bit line refers to a voltage for indicating a low state of the data stored in the capacitor 160.

For example, in case where the memory cell 170 is selected, the voltage ($V_{W/L,selected} > V_{B/L,max} + V_{pi}$) greater than the sum of the maximal voltage ($V_{B/L,max}$) of the bit line and the pull-in voltage ($V_{pi}$) or the voltage ($V_{W/L,selected} < V_{B/L,min} - V_{pi}$) smaller than the difference between the minimal voltage ($V_{B/L,min}$) of the bit line and the pull-in voltage ($V_{pi}$) is applied to the word line (W/L0). The voltage ($V_{B/L,max} - V_{pi} < V_{W/L,unselected} < V_{B/L,min} + V_{pi}$) smaller than the sum of the minimal voltage ($V_{B/L,min}$) of the bit line and the pull-in voltage ($V_{pi}$) and greater than the difference between the maximal voltage ($V_{B/L,max}$) of the bit line and the pull-in voltage ($V_{pi}$) is applied to the word lines (W/L1 and W/L2). The maximal voltage ($V_{B/L,max}$) of the bit line or the minimal voltage ($V_{B/L,min}$) of the bit line are applied to the bit line.

Under the conditions, a difference between the application voltage of the gate electrode 120 connecting to the word line (W/L0) and the application voltage of the source electrode 150 connecting to the bit line (B/L0) becomes more than the pull-in voltage. Therefore, the electrostatic force is generated and the dimple 153 of the source electrode 150 contacts with the drain electrode 140. By doing so, the maximal voltage ($V_{B/L,max}$) of the bit line applied to the bit line (B/L0) or the minimal voltage ($V_{B/L,min}$) of the bit line can be transferred to the capacitor 160 through the drain electrode 140, and can be stored in the capacitor 160.

Figure 4:
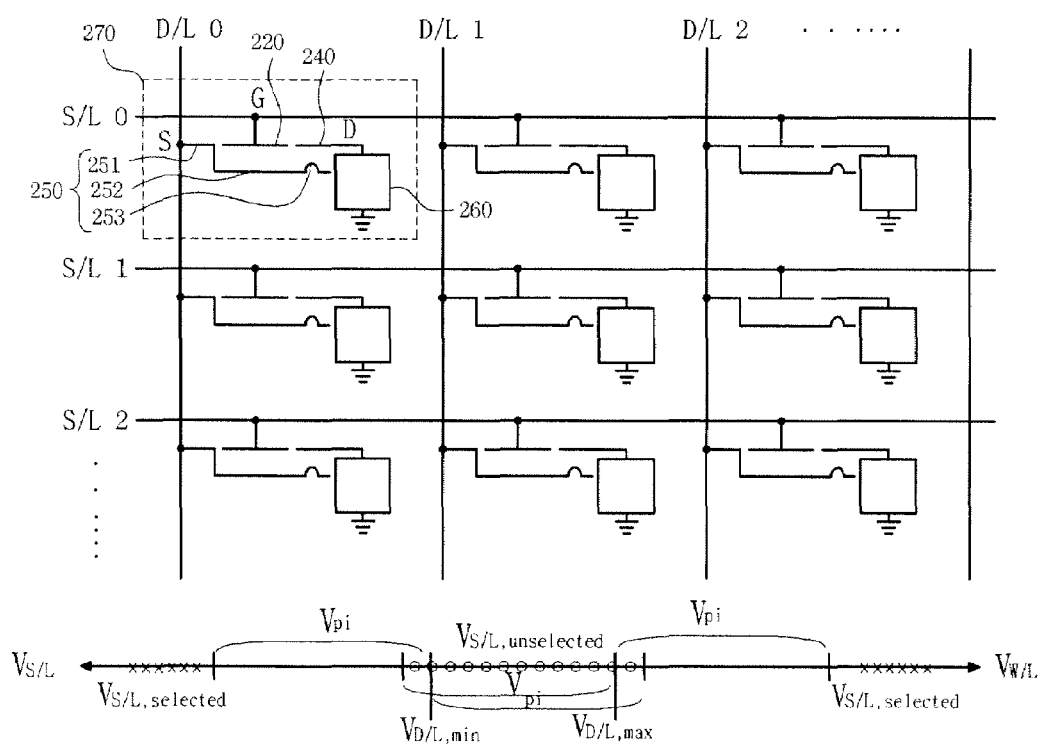
FIG. 4 is a circuit diagram illustrating a display apparatus using a mechanical switch according to an exemplary embodiment of the present invention.

FIG. 4 is a circuit diagram illustrating a display apparatus using a mechanical switch according to an exemplary embodiment of the present invention.

As shown in FIG. 4, the display apparatus using the mechanical switch according to an exemplary embodiment of the present invention comprises a plurality of scan lines (S/L0, S/L1, and S/L2), a plurality of data lines (D/L0, D/L1, and D/L2), and a plurality of the mechanical switches.

The plurality of data lines (D/L0, D/L1, and D/L2) intersects each other with the plurality of scan lines (S/L0, S/L1, and S/L2). The plurality of mechanical switches is disposed at an intersection of the plurality of scan lines (S/L0, S/L1, and S/L2) and the plurality of data lines (D/L0, D/L1, and D/L2). Each of the mechanical switches comprises a gate electrode 220 connecting with each of the scan lines (S/L0, S/L1, and S/L2); a drain electrode 240 spaced apart from the gate electrode 220 and connecting to a pixel 260; and a source electrode 250. The source electrode 250 comprises an anchor part 251 spaced apart from the gate electrode 220 and connecting to each of the data lines (D/L0, D/L1, and D/L2); a mobile part 252 extending from the anchor part 251 and spaced apart from the gate electrode 220; and a dimple 253 extending from the mobile part 252 and formed in a protrusion shape.

In each the plurality of mechanical switches, the dimple 253 of the source electrode 250 electrically contacts with the drain electrode 240 by a difference between a voltage applied to the gate electrode 220 and a voltage applied to the source electrode 250, and the voltage applied to the source electrode 250 is transferred to the drain electrode 240. In other words, when the difference between the voltage applied to the gate electrode 220 and the voltage applied to the source electrode 250 is more than a pull-in voltage ($V_{pi}$), an electrostatic force is generated, thereby making the dimple 253 of the source electrode 250 electrically contact with the drain electrode 240, and transferring the voltage applied to the source electrode 250 to the drain electrode 240.

In generation of the electrostatic force, the dimple 253 of the source electrode 250 contacts with the drain electrode 240 so that the voltage applied to the source electrode 250 can be transferred to the pixel 260 through the drain electrode 240. In the absence of the generation of the electrostatic force, the dimple 253 of the source electrode 250 is again restored to an original position by an elastic force, and does not contact with the drain electrode 240. As such a structure, a cantilever is typical. Also, the dimple 253 of the source electrode 250 can not only prevents a stiction in a manufacturing process of the mechanical switch but also reduces the pull-in voltage ($V_{pi}$).

In each of the plurality of mechanical switches, the gate electrode 220, the source electrode 250, and the drain electrode 240 can be formed of conductive material comprising any one of copper, carbon nano tube, and polysilicon. The plurality of scan lines (S/L0, S/L1, and S/L2) and the plurality of data lines (D/L0, D/L1, and D/L2) can be formed of conductive material comprising any one of copper, carbon nano tube, and polysilicon.

In order to effectively control pixel cells of the display apparatus using the mechanical switch according to an exemplary embodiment of the present invention, voltages are applied to the plurality of scan lines (S/L0, S/L1, and S/L2) under the conditions of ① and ③.

①Condition of applying voltage to selected scan line:

$|V_{S/L,selected} - V_{D/L}| > V_{pi}$ ($V_{S/L,selected} > V_{D/L,max} + V_{pi}$ or $V_{S/L,selected} < V_{D/L,min} - V_{pi}$)

②Condition of applying voltage to unselected scan line:

$|V_{S/L,unselected} - V_{D/L}| < V_{pi}$ ($V_{D/L,max} - V_{pi} < V_{S/L,unselected} < V_{D/L,min} + V_{pi}$)

③Pull-in voltage:

$V_{pi} > |V_{D/L,max} - V_{D/L,min}|$

A voltage ($V_{S/L,selected} > V_{D/L,max} + V_{pi}$) greater than a sum of a maximal voltage ($V_{D/L,max}$) of the data line and the pull-in voltage ($V_{pi}$) or a voltage ($V_{SL,selected} < V_{D/L,min} - V_{pi}$) smaller than a difference between a minimal voltage ($V_{D/L,min}$) of the data line and the pull-in voltage ($V_{pi}$) is applied to the scan line (S/L0) selected from the plurality of scan lines (S/L0, S/L1, and S/L2). A voltage ($V_{D/L,max} - V_{pi} < V_{S/L,unselected} < V_{D/L,min} + V_{pi}$) smaller than a sum of the minimal voltage ($V_{D/L,min}$) of the data line and the pull-in voltage ($V_{pi}$) and greater than a difference between the maximal voltage ($V_{D/L,max}$) of the data line and the pull-in voltage ($V_{pi}$) is applied to the scan lines (S/L1 and S/L2) unselected from the plurality of scan lines (S/L0, S/L1, and S/L2). The pull-in voltage ($V_{pi} > |V_{D/L,max} - V_{D/L,min}|$) is greater than a difference between the maximal voltage ($V_{D/L,max}$) of the data line and the minimal voltage ($V_{D/L,min}$) of the data line. The maximal voltage ($V_{D/L,max}$) of the data line refers to a maximal data voltage transferred to the pixel 260. The minimal voltage ($V_{D/L\_min}$) of the data line refers to a minimal data voltage transferred to the pixel 260.

For example, in case where the pixel cell 270 is selected, the voltage ($V_{S/L,selected} > V_{D/L,max} + V_{pi}$) greater than the sum of the maximal voltage ($V_{D/L,\ max}$) of the data line and the pull-in voltage ($V_{pi}$) or the voltage ($V_{S/L,selected} < V_{D/L,min} - V_{pi}$) smaller than the difference between the minimal voltage ($V_{D/L,min}$) of the data line and the pull-in voltage ($V_{pi}$) is applied to the scan line (S/L0). The voltage ($V_{D/L,max} - V_{pi} < V_{S/L,unselected} < V_{D/L,min} + V_{pi}$) smaller than the sum of the minimal voltage ($V_{D/L,min}$) of the data line and the pull-in voltage ($V_{pi}$) and greater than the difference between the maximal voltage ($V_{D/L,max}$) of the data line and the pull-in voltage ($V_{pi}$) is applied to the scan lines (S/L1 and S/L2). A voltage between the minimal voltage ($V_{D/L,min}$) of the data line or the maximal voltage ($V_{D/L,max}$) of the data line are applied to the data line.

Under the conditions, a difference between the application voltage of the gate electrode 220 connecting to the scan line (S/L0) and the application voltage of the source electrode 250 connecting to the data line (D/L0) becomes more than the pull-in voltage ($V_{pi}$). Therefore, the electrostatic force is generated and the dimple 253 of the source electrode 250 electrically contacts with the drain electrode 240. By doing so, the minimal voltage ($V_{D/L,min}$) of the data line applied to the data line (D/L0) or the maximal voltage ($V_{D/L,max}$) of the data line can be transferred to the pixel 260 through the drain electrode 240, thereby displaying pixel data associated with the voltage between the minimal voltage ($V_{D/L,min}$) of the data line or the maximal voltage ($V_{D/L,\ max}$) of the data line.

As described above, the memory array according to an exemplary embodiment of the present invention uses the mechanical switch with the dimple, thereby facilitating its construction without the use of the semiconductor transistor.

Also, the memory array using the mechanical switch according to an exemplary embodiment of the present invention can be provided as a military or satellite nonvolatile mechanical memory array in which an operation voltage is lower than that of a conventional flash memory, thereby reducing a power consumption, in which an operation speed is made fast, in which there is not a degradation of an electrical reliability like a breakdown of a gate insulating film, and in which a sensitivity to an external harmful environment such as radiation is poor.

The use of the conductive electrode on an arbitrary substrate instead of the semiconductor substrate can provide the memory array in which integration can be implemented irrespective of a substrate kind as well as a multi-bit cell storage can be made, as it easily transfers any source voltage to the drain in the capacitor.

In the method for controlling the memory array using the mechanical switch according to an exemplary embodiment of the present invention, the application voltage of the selected word line and the application voltage of the unselected word line can be controlled, thereby effectively selecting the memory cell of the memory array.

In the display apparatus using the mechanical switch according to an exemplary embodiment of the present invention, the mechanical switch with the dimple can be used, thereby easily constructing the display apparatus without the use of the semiconductor transistor.

In the method for controlling the display apparatus using the mechanical switch according to an exemplary embodiment of the present invention, the application voltage of the selected scan line and the application voltage of the unselected scan line can be controlled, thereby effectively displaying a data voltage in the pixel cell.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A memory array using a mechanical switch, the memory array comprising:
    a plurality of word lines;
    a plurality of bit lines intersecting each other with the plurality of word lines; and
    a plurality of the mechanical switches,
    the mechanical switch disposed at an intersection of the plurality of word lines and the plurality of bit lines, and comprising:
        a gate electrode connecting with each of the word lines;
        a drain electrode spaced apart from the gate electrode and connecting to a capacitor; and
        a source electrode,
        the source electrode comprising:
            an anchor part spaced apart from the gate electrode and connecting to each of the bit lines;
            a mobile part extending from the anchor part and spaced apart from the gate electrode; and
            a dimple extending from the mobile part and formed in a protrusion shape.

2. The memory array of claim 1, wherein, in each of the mechanical switches, the dimple of the source electrode electrically contacts with the drain electrode by a difference between a voltage applied to the gate electrode and a voltage applied to the source electrode, and the voltage applied to the source electrode is transferred to the drain electrode.

3. The memory array of claim 1, wherein the capacitor comprises a first electrode, a second electrode, and a dielectric layer formed between the first electrode and the second electrode.

4. The memory array of claim 3, wherein the first electrode is a conductive electrode formed on a conductive semiconductor substrate or a nonconductive semiconductor substrate.

5. The memory array of claim 3, wherein the dielectric layer is formed of silicon oxide or silicon nitride.

6. The memory array of claim 3, wherein the second electrode is formed of conductive material comprising any one of copper, carbon nano tube, and polysilicon.

7. The memory array of claim 1, wherein the gate electrode, the source electrode, and the drain electrode of each of the mechanical switches is formed of conductive material comprising any one of copper, carbon nano tube, and polysilicon.

8. The memory array of claim 1, wherein the plurality of word lines and the plurality of bit lines are formed of conductive material comprising any one of copper, carbon nano tube, and polysilicon.

9. A method for controlling a memory array using a mechanical switch, in which the memory array comprises: a plurality of word lines; a plurality of bit lines intersecting each other with the plurality of word lines; and a plurality of the mechanical switches, and the mechanical switch disposed at an intersection of the plurality of word lines and the plurality of bit lines comprises: a gate electrode connecting with each of the word lines; a drain electrode spaced apart from the gate electrode and connecting to a capacitor; and a source electrode, and the source electrode comprises: an anchor part spaced apart from the gate electrode and connecting to each of the bit lines; a mobile part extending from the anchor part and spaced apart from the gate electrode; and a dimple extending from the mobile part and formed in a protrusion shape, the method comprising steps of:

applying a voltage greater than a sum of a maximal voltage ($V_{B/L,max}$) of the bit line and a pull-in voltage or a voltage smaller than a difference between a minimal voltage ($V_{B/L,min}$) of the bit line and the pull-in voltage, to the word line selected from the plurality of word lines; and applying a voltage smaller than a sum of the minimal voltage ($V_{B/L,min}$) of the bit line and the pull-in voltage and greater than a difference between the maximal voltage ($V_{B/L,max}$) of the bit line and the pull-in voltage, to the word lines unselected from the plurality of word lines.

10. The method of claim 9, wherein the pull-in voltage is greater than a difference between the maximal voltage ($V_{B/L,max}$) of the bit line and the minimal voltage ($V_{B/L,min}$) of the bit line.

* * * * *